(12) United States Patent
Yoshitake

(10) Patent No.: US 11,555,120 B2
(45) Date of Patent: Jan. 17, 2023

(54) ORGANOPOLYSILOXANE COMPOSITION, AND HALF-CURED PRODUCT AND CURED PRODUCT PRODUCED FROM SAME

(71) Applicant: DOW TORAY CO., LTD., Tokyo (JP)

(72) Inventor: Makoto Yoshitake, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 318 days.

(21) Appl. No.: 16/760,544

(22) PCT Filed: Oct. 30, 2018

(86) PCT No.: PCT/JP2018/040247
§ 371 (c)(1),
(2) Date: Apr. 30, 2020

(87) PCT Pub. No.: WO2019/088066
PCT Pub. Date: May 9, 2019

(65) Prior Publication Data
US 2021/0179849 A1 Jun. 17, 2021

(30) Foreign Application Priority Data
Oct. 31, 2017 (JP) .............................. JP2017-211401

(51) Int. Cl.
| C08G 77/12 | (2006.01) |
| C08L 83/04 | (2006.01) |
| B29D 11/00 | (2006.01) |
| C08G 77/08 | (2006.01) |
| C08G 77/20 | (2006.01) |
| C09J 183/04 | (2006.01) |
| G02B 1/04 | (2006.01) |

(52) U.S. Cl.
CPC .......... *C08L 83/04* (2013.01); *B29D 11/0073* (2013.01); *C08G 77/08* (2013.01); *C08G 77/12* (2013.01); *C08G 77/20* (2013.01); *C09J 183/04* (2013.01); *G02B 1/04* (2013.01)

(58) Field of Classification Search
CPC ......... C08G 77/12; C08G 77/20; C08L 83/04; B01J 23/42; B01J 23/44; B01J 23/46; B32B 2310/08
See application file for complete search history.

(56) References Cited

U.S. PATENT DOCUMENTS

| 3,852,832 | A | 12/1974 | McGhan et al. |
| 4,510,094 | A | 4/1985 | Drahnak |
| 4,587,137 | A | 5/1986 | Eckberg |
| 4,603,168 | A | 7/1986 | Sasaki et al. |
| 2006/0105480 | A1 | 5/2006 | Boardman et al. |
| 2009/0123764 | A1 | 5/2009 | Morita et al. |
| 2010/0183814 | A1 | 7/2010 | Rios et al. |
| 2010/0225010 | A1 | 9/2010 | Katayama |
| 2011/0003906 | A1 | 1/2011 | Angermaier et al. |
| 2012/0142803 | A1 | 6/2012 | Inafuku et al. |
| 2012/0168780 | A1 | 7/2012 | Cha et al. |
| 2013/0072592 | A1 | 3/2013 | Inafuku et al. |

FOREIGN PATENT DOCUMENTS

| CN | 102585512 A | 7/2012 |
| CN | 102791800 A | 11/2012 |
| EP | 1731570 A1 | 12/2006 |
| JP | S60177029 A | 9/1985 |
| JP | S6195069 A | 5/1986 |
| JP | S61162561 A | 7/1986 |
| JP | H05239216 A | 9/1993 |
| JP | 2003213132 A | 7/2003 |
| JP | 2005194474 A | 7/2005 |
| JP | 2009220084 A | 10/2009 |
| JP | 2009270067 A | 11/2009 |
| JP | 2010047646 A | 3/2010 |
| JP | 2010202801 A | 9/2010 |
| JP | 2011012264 A | 1/2011 |
| JP | 2012121960 A | 6/2012 |
| JP | 2013063391 A | 4/2013 |
| JP | 2014082399 A | 5/2014 |

(Continued)

OTHER PUBLICATIONS

English translation of International Search Report for PCT/JP2018/040247 dated Feb. 5, 2018, 2 pages.
Machine assisted English translation of JPS61162561A obtained from https://worldwide.espacenet.com on Apr. 29, 2020, 11 pages.
Machine assisted English translation of JP2003213132A obtained from https://patents.google.com/patent on Apr. 29, 2020, 10 pages.
Machine assisted English translation of JP2009220084A obtained from https://patents.google.com/patent on Apr. 29, 2020, 11 pages.
Machine assisted English translation of JP2009270067A obtained from https://patents.google.com/patent on Apr. 29, 2020, 9 pages.
Machine assisted English translation of JP2010047646A obtained from https://patents.google.com/patent on Apr. 29, 2020, 10 pages.
Machine assisted English translation of JP2014082399A obtained from https://patents.google.com/patent on Apr. 29, 2020, 11 pages.

(Continued)

*Primary Examiner* — Kuo Liang Peng
(74) *Attorney, Agent, or Firm* — Warner Norcross + Judd LLP

(57) ABSTRACT

Provided is a hydrosilylation reactive composition that has a sufficient pot life at room temperature, that can be cured at low temperature by exposure to high energy radiation, and that produces a stable semi-cured product during the curing process, and to provide a semi-cured product and a cured product obtained using this hydrosilylation reactive composition. The composition comprises: (A) a compound containing at least one aliphatically unsaturated monovalent hydrocarbon group in the molecule; (B) a compound containing at least two hydrogen atoms bonded to silicon atoms in the molecule; (C) a first hydrosilylation catalyst exhibiting activity in the composition without exposure to high energy radiation; and (D) a second hydrosilylation catalyst not exhibiting activity unless exposed to high energy radiation, and exhibiting activity in the composition by exposure to high energy radiation.

13 Claims, No Drawings

(56) References Cited

FOREIGN PATENT DOCUMENTS

| | | | |
|---|---|---|---|
| JP | 2015214637 | A | 12/2015 |
| WO | 2007047289 | * | 4/2007 |
| WO | 2007047289 | A1 | 4/2007 |
| WO | 2017079502 | A1 | 5/2017 |

OTHER PUBLICATIONS

Machine assisted English translation of JP2015214637A obtained from https://patents.google.com/patent on Apr. 29, 2020, 14 pages.
Machine assisted English translation of JP2005194474A obtained from https://patents.google.com/patent on Jul. 12, 2022, 10 pages.

* cited by examiner

ORGANOPOLYSILOXANE COMPOSITION, AND HALF-CURED PRODUCT AND CURED PRODUCT PRODUCED FROM SAME

CROSS-REFERENCE TO RELATED APPLICATIONS

This application is the National Stage of International Appl. No. PCT/JP2018/040247 filed on 30 Oct. 2018, which claims priority to and all advantages of Japanese Appl. No. 2017-211401 filed on 31 Oct. 2017, the content of which is hereby incorporated by reference.

TECHNICAL FIELD

The present invention relates to an organopolysiloxane composition curable by hydrosilylation reaction and to a semi-cured product and cured product produced from this composition.

BACKGROUND ART

Because silicone materials have excellent performance in terms of heat resistance, chemical resistance, and electrical insulating properties, they are used in a wide variety of applications. Silicone materials can be formed on various substrates such as plastics, metals, glass, ceramics, paper, and wood, and applications include consumer goods, medical supplies, and electronic components. Silicone materials are usually obtained by crosslinking organopolysiloxanes using a hydrosilylation reaction. In a hydrosilylation reaction, a transition metal complex catalyst that is activated by heat is commonly used from the standpoint of workability. However, when a silicone material is formed on a substrate such as a thermoplastic resin film, the substrate cannot be subjected to high temperatures. Therefore, catalysts activated by exposure to high energy radiation such as ultraviolet radiation are used (Patent Document 1).

However, organopolysiloxane compositions that use high energy radiation activated catalysts are not cured immediately even when exposed to high energy radiation. When heat is applied to cure a composition in a shorter period of time or the amount of catalyst used is increased to cure a composition in a shorter period of time, the cured product may become discolored. When curing is performed at a lower temperature using a smaller amount of catalyst, the curing reaction is not completed and the resulting cured product has low mechanical strength. When the curing reaction is completed in a shorter period of time at a lower temperature using a catalyst activated by heat, the amount of the catalyst has to be increased. This either discolors the cured product or quickly increases the viscosity of the composition and shortens the pot life at room temperature.

When the hydrosilylation reaction is performed in stages and a viscous or a thermoplastic material has to remain stable during the curing process, curing has to be performed at a high temperature using only a heat-activated catalyst. When a high energy radiation activated catalyst is used alone, a hydrosilylation reaction cannot be controlled in the first stage, and it is difficult to obtain a stable viscous or thermoplastic material.

Also, when a high energy radiation activated catalyst is used alone, curing only occurs in the portions exposed to high energy radiation. As a result, the portions shielded from exposure to high energy radiation are not cured.

PRIOR ART DOCUMENTS

Patent Documents

Patent Document 1: JP H05-239216 A

SUMMARY OF THE INVENTION

Problem to be Solved by the Invention

Therefore, it is an object of the present invention to provide a composition that has a sufficient pot life at room temperature, that can be cured at low temperature by exposure to high energy radiation, and that produces a viscous or a thermoplastic material during the curing process to improve subsequent workability.

Means for Solving the Problem

The present invention is a composition comprising: (A) a compound containing at least one aliphatically unsaturated monovalent hydrocarbon group in the molecule; (B) a compound containing at least two hydrogen atoms bonded to silicon atoms in the molecule; (C) a first hydrosilylation catalyst exhibiting activity in the composition without exposure to high energy radiation; and (D) a second hydrosilylation catalyst not exhibiting activity unless exposed to high energy radiation, and exhibiting activity in the composition by exposure to high energy radiation.

The high energy radiation is preferably any one selected from among ultraviolet radiation, gamma radiation, X-ray radiation, alpha radiation, or electron beam radiation, and preferably at least one of component (A) and component (B) is an organopolysiloxane.

Preferably, component (A) is an organopolysiloxane represented by average composition formula (1):

$$R^1_a R^2_b SiO_{(4-a-b)/2} \quad (1)$$

(where $R^1$ is an alkenyl group having from 2 to 12 carbon atoms, $R^2$ is a group selected from among an aliphatic unsaturated bond-free monovalent hydrocarbon group, hydroxyl group and alkoxy group having from 1 to 12 carbon atoms, and a and b are numbers that satisfy the following conditions: $1 \leq a+b \leq 3$ and $0.001 \leq a/(a+b) \leq 0.33$); and component (B) is an organopolysiloxane represented by average composition formula (2):

$$H_c R^3_d SiO_{(4-c-d)/2} \quad (2)$$

(where $R^3$ is a group selected from among an aliphatic unsaturated bond-free monovalent hydrocarbon group, hydroxyl group and alkoxy group having from 1 to 12 carbon atoms, and c and d are numbers that satisfy the following conditions: $1 \leq c+d \leq 3$ and $0.01 \leq c/(c+d) \leq 0.33$).

Preferably, component (B) is an organohydrogenpolysiloxane represented by average composition formula (3):

$$(HR^4_2SiO_{1/2})_e(R^4_3SiO_{1/2})_f(HR^4SiO_{2/2})_g(R^4_2SiO_{2/2})_h$$
$$(HSiO_{3/2})_i(R^4SiO_{3/2})_j(SiO_{4/2})_k(R^5O_{1/2})_l \quad (3)$$

(where $R^4$ is a group selected from among an aliphatic unsaturated bond-free monovalent hydrocarbon group, hydroxyl group and alkoxy group having from 1 to 12 carbon atoms, $R^5$ is a hydrogen atom or alkyl group having from 1 to 6 carbon atoms, and e, f, g, h, i, j, k and l are numbers that satisfy the following conditions: $e+f+g+h+i+j+k=1$, $0 \leq l \leq 0.1$, $0.01 \leq e+g+i \leq 0.2$, $0.01 \leq e \leq 0.6$, $0.01 \leq g \leq 0.6$, $0 \leq i \leq 0.4$, $0.01 \leq e+f \leq 0.8$, $0.01 \leq g+h \leq 0.8$, and $0 \leq i+j \leq 0.6$).

Preferably, the molar ratio ((C)/(D)) of component (C) to component (D) is from 0.001 to 1,000. Preferably, component (C) is at least one selected from transition metal complex catalysts selected from platinum, palladium, rhodium, nickel, iridium, ruthenium, and iron complexes. Preferably, component (D) is at least one selected from (substituted and unsubstituted cyclopentadienyl) trimethylplatinum (IV), β-diketonato trimethylplatinum (IV), and bis (β-diketonato) platinum (II).

Another aspect of the present invention relates to a semi-cured product obtained by conducting a first hydrosilylation reaction on this composition without exposure to high energy radiation.

Another aspect of the present invention relates to a cured product obtained by exposing the semi-cured product to high energy radiation.

Effects of the Invention

The present invention is able to provide a composition that has a sufficient pot life at room temperature, that can be cured at low temperature once initiated by exposure to high energy radiation, and that produces a viscous or a thermoplastic material during the curing process. Here, the portions shielded from exposure to high energy radiation can be cured over time.

Embodiment of the Invention (Composition)

A composition of the present invention contains components (A) to (D) below. They will now be described in order.

Component (A)

A composition of the present invention includes a compound containing at least one aliphatically unsaturated monovalent hydrocarbon group in the molecule (component (A)). Component (A) is a compound containing an aliphatically unsaturated monovalent hydrocarbon group to which a hydrosilyl group (—SiH) is added during the hydrosilylation reaction. Examples of compound (A) include alkenyl group-containing linear or branched organopolysiloxanes, alkenyl group-containing polyethers, alkenyl group-containing polyolefins, and alkenyl group-containing polyesters. Among these, organopolysiloxanes represented by average composition formula (1) below are preferred.

$$R^1_a R^2_b SiO_{(4-a-b)/2} \quad (1)$$

In general formula (1), $R^1$ is an alkenyl group having from 2 to 12 carbon atoms. Specific examples include a vinyl group, allyl group, butenyl group, pentenyl group, hexenyl group, heptenyl group, octenyl group, nonenyl group, decenyl group, undecenyl group, and dodecenyl group. Among these, a vinyl group, an allyl group or a hexenyl group is preferred. $R^2$ is a group selected from among an aliphatic unsaturated bond-free monovalent hydrocarbon group, hydroxyl group and alkoxy group having from 1 to 12 carbon atoms. In the monovalent hydrocarbon groups having from 1 to 12 carbon atoms, some of the hydrogen atoms may be substituted by a halogen atom or a hydroxyl group. Examples of monovalent hydrocarbon groups having from 1 to 12 carbon atoms include alkyl groups such as a methyl group, ethyl group, propyl group, butyl group, pentyl group, hexyl group, heptyl group, octyl group, nonyl group, decyl group, undecyl group or dodecyl group, aryl groups such as a phenyl group, tolyl group, xylyl group, naphthyl group, anthracenyl group, phenanthryl group or pyrenyl group, aralkyl groups such as a benzyl group, phenethyl group, naphthylethyl group, naphthylpropyl group, anthracenylethyl group, phenanthrylethyl group or pyrenylethyl group, and these groups in which hydrogen atoms in the aryl groups or aralkyl groups are substituted with alkyl groups such as a methyl group or ethyl group, alkoxy groups such as a methoxy group or ethoxy group, or halogen atoms such as chlorine atom or bromine atom.

Here, a and b are numbers that satisfy the following conditions: 1≤a+b≤3 and 0.001≤a/(a+b)≤0.33), and preferably following conditions: 1.5≤a+b≤2.5 and 0.005≤a/(a+b)≤0.2. When a+b is 1 or more, the flexibility of the cured product is increased. When a+b is 3 or less, the mechanical strength of the cured product is increased. When a/(a+b) is 0.001 or less, the mechanical strength of the cured product is increased. When the sum is 0.33 or less, the flexibility of the cured product is increased.

The molecular structure of the organopolysiloxane is linear, branched, or cyclic. The organopolysiloxane may be one compound or a mixture of two or more compounds with one of these molecular structures.

Component (A) is preferably a linear organopolysiloxane represented by the general formula: $R^6_3SiO(R^6_2SiO)_{m1}SiR^6_3$ and/or a branched organopolysiloxane represented by the average unit formula: $(R^6SiO_{3/2})_{g1}(R^6_2SiO_{2/2})_{h1}(R^6_3SiO_{1/2})_{i1}(SiO_{4/2})_{j1}(XO_{1/2})_{k1}$. In these formulas, each $R^6$ is independently an unsubstituted or halogen-substituted monovalent hydrocarbon group. Examples include those listed above. However, at least two $R^6$ in the molecule are alkenyl groups. The alkenyl group is preferably a vinyl group. Because attenuation of the resulting cured product due to light refraction, light reflection, and light scattering is low, at least 30 mol % of all $R^6$ groups in the molecule are aryl groups, and preferably at least 40 mol % of these groups are aryl groups. The aryl group is preferably a phenyl group. In these formulas, m1 is an integer in a range from 5 to 1,000. In the latter formula, g1 is a positive number, h1 is 0 or a positive number, i1 is 0 or a positive number, j1 is 0 or a positive number, k1 is 0 or a positive number, h1/g1 is a number in a range from 0 to 10, i1/g1 is a number in a range from 0 to 5, j1/(g1+h1+i1+j1) is a number in a range from 0 to 0.3, k1/(g1+h1+i1+j1) is a number in a range from 0 to 0.4.

Component (B)

Component (B) is a compound having at least two hydrogen atoms bonded to silicon atoms in the molecule, and is a compound containing the hydrosilyl group (—SiH) added during the hydrosilylation reaction to the aliphatically unsaturated group in component (A). Component (B) is preferably an organopolysiloxane represented by average composition formula (2) below.

$$H_c R^3_d SiO_{(4-c-d)/2} \quad (2)$$

In general formula (2), $R^3$ is a group selected from among an aliphatic unsaturated bond-free monovalent hydrocarbon group, hydroxyl group and alkoxy group having from 1 to 12 carbon atoms. In the monovalent hydrocarbon groups having from 1 to 12 carbon atoms, some of the hydrogen atoms may be substituted by a halogen atom or a hydroxyl group. Examples of monovalent hydrocarbon groups having from 1 to 12 carbon atoms include alkyl groups such as a methyl group, ethyl group, propyl group, butyl group, pentyl group, hexyl group, heptyl group, octyl group, nonyl group, decyl group, undecyl group or dodecyl group, aryl groups such as a phenyl group, tolyl group, xylyl group, naphthyl group, anthracenyl group, phenanthryl group or pyrenyl group, aralkyl groups such as a benzyl group, phenethyl group, naphthylethyl group, naphthylpropyl group, anthracenylethyl group, phenanthrylethyl group or pyrenylethyl group, and these groups in which hydrogen atoms in the aryl groups or aralkyl groups are substituted with alkyl groups such as a methyl group or ethyl group, alkoxy groups such as a methoxy group or ethoxy group, or halogen atoms such as chlorine atom or bromine atom. Examples of alkoxy groups include a methoxy group, ethoxy group, propoxy group, butoxy group, pentanoxy group, hexaoxy group, or octanoxy group.

Here, c and d are numbers that satisfy the following conditions: $1 \leq c+d \leq 3$ and $0.01 \leq c/(c+d) \leq 0.33$, and preferably following conditions: $1.5 \leq c+d \leq 2.5$ and $0.05 \leq c/(c+d) \leq 0.2$. When c+d is 1 or more, the flexibility of the cured product is increased. When the sum is 3 or less, the mechanical strength of the cured product is increased. When c/(c+d) is 1.5 or more, the mechanical strength of the cured product is increased. When the sum is 2.5 or less, the flexibility of the cured product is increased.

There are no particular restrictions on the viscosity of an organopolysiloxane represented by average composition formula (2). However, the viscosity at 25° C. is preferably in a range from 0.5 to 10,000 mPa·s and more preferably in a range from 1 to 1,000 mPa·s.

Examples of organopolysiloxanes represented by average composition formula (2) include 1,1,3,3-tetramethyldisiloxane, 1,3,5,7-tetramethylcyclotetrasiloxane, tris (dimethyl hydrogensiloxy) methylsilane, tris (dimethyl hydrogensiloxy) phenylsilane, 1-(3-glycidoxypropyl)-1,3,5,7-tetramethylcyclotetrasiloxane, 1,5-di (3-glycidoxypropyl)-1,3,5,7-tetramethylcyclotetrasiloxane, 1-(3-glycidoxypropyl)-5-trimethoxysilylethyl-1,3,5,7-tetramethylcyclotetrasiloxane, methyl hydrogen polysiloxane capped on both ends of the molecular chain with a trimethylsiloxy group, dimethylsiloxane/methylhydrogensiloxane copolymers capped on both ends of the molecular chain with a trimethylsiloxy group, dimethyl polysiloxane capped on both ends of the molecular chain with a dimethyl hydrogensiloxy group, a dimethylsiloxane/methylhydrogensiloxane copolymer capped on both ends of the molecular chain with a dimethyl hydrogensiloxy group, a methyl hydrogen siloxane/diphenyl siloxane copolymer capped on both ends of the molecular chain with a trimethylsiloxy group, a methyl hydrogen siloxane/diphenyl siloxane/dimethyl siloxane copolymer capped on both ends of the molecular chain with a trimethylsiloxy group, a hydrolysis condensation product of trimethoxysilane, a copolymer consisting of $(CH_3)_2HSiO_{1/2}$ units and $SiO_{4/2}$ units, a copolymer consisting of $(CH_3)_2HSiO_{1/2}$ units and $(C_6H_5)SiO_{3/2}$ units, and mixtures of two or more of these compounds.

The following are specific examples of organopolysiloxanes represented by average composition formula (2). In these formulas, Me and Ph represent a methyl group and a phenyl group, m2 is an integer from 1 to 100, n2 is an integer from 1 to 50, b2, c2, d2 and e2 are each positive numbers, and the sum of b2, c2, d2 and e2 in the molecule is 1.

$HMe_2SiO(Ph_2SiO)_{m2}SiMe_2H$ $HMePhSiO(Ph_2SiO)_{m2}SiMePhH$ $HMePhSiO(Ph_2SiO)_{m2}(MePhSiO)_{n2}SiMePhH$ $HMePhSiO(Ph_2SiO)_{m2}(Me_2SiO)_{n2}SiMePhH$ $(HMe_2SiO_{1/2})_{b2}(PhSiO_{3/2})_{c2}$ $(HMePhSiO_{1/2})_{b2}(PhSiO_{3/2})_{c2}$ $(HMePhSiO_{1/2})_{b2}(HMe_2SiO_{1/2})_{c2}(PhSiO_{3/2})_{d2}$ $(HMe_2SiO_{1/2})_{b2}(Ph_2SiO_{2/2})_{c2}(PhSiO_{3/2})_{d2}$ $(HMePhSiO_{1/2})_{b2}(Ph_2SiO_{2/2})_{c2}(PhSiO_{3/2})_{d2}$ $(HMePhSiO_{1/2})_{b2}(HMe_2SiO_{1/2})_{c2}(Ph_2SiO_{2/2})_{d2}(PhSiO_{3/2})_{e2}$

Preferably, component (B) is an organohydrogenpolysiloxane represented by average composition formula (3).

$$(HR^4{}_2SiO_{1/2})_e(R^4{}_3SiO_{1/2})_f(HR^4SiO_{2/2})_g(R^4{}_2SiO_{2/2})_h (HSiO_{3/2})_i(R^4SiO_{3/2})_j(SiO_{4/2})_k(R^5O_{1/2})_l \quad (3)$$

In formula (3), $R^4$ is a group selected from among an aliphatic unsaturated bond-free monovalent hydrocarbon group, hydroxyl group and alkoxy group having from 1 to 12 carbon atoms. The aliphatic unsaturated bond-free monovalent hydrocarbon groups, hydroxyl groups and alkoxy groups having from 1 to 12 carbon atoms are the same as those mentioned above. $R^5$ is a hydrogen atom or alkyl group having from 1 to 6 carbon atoms. Examples of alkyl group having from 1 to 6 carbon atoms include a methyl group, ethyl group, propyl group, butyl group, and hexyl group. Here, e, f, g, h, i, j, k and l are numbers that satisfy the following conditions: $e+f+g+h+i+j+k=1$, $0 \leq l \leq 0.1$, $0.01 \leq e+g+i \leq 0.2$, $0 \leq e \leq 0.6$, $0 \leq g \leq 0.6$, $0 \leq i \leq 0.4$, $0.01 \leq e+f \leq 0.8$, $0.01 \leq g+h \leq 0.8$, and $0 \leq i+j \leq 0.6$).

The structural units $HR^4{}_2SiO_{1/2}$, $R^4{}_3SiO_{1/2}$, $HR^4SiO_{2/2}$, $R^4{}_2SiO_{2/2}$, $HSiO_{3/2}$, $R^4SiO_{3/2}$ and $SiO_{4/2}$ mentioned above are partial structural units of an organohydrogenpolysiloxane referred to below, respectively, as a MH unit, M unit, DH unit, D unit, TH unit, T unit, and Q unit. $R^5O_{1/2}$ is a group that bonds to an oxygen atom in a D unit, DH unit, T unit, TH unit, or Q unit, and refers to a silicon-bonded hydroxyl group (Si—OH) in the organopolysiloxane or a silicon-bonded alkoxy group remaining unreacted during organopolysiloxane production. An MH unit is present in an organohydrogenpolysiloxane primarily at the ends of the molecular chain, and a DH unit is present in the molecular chain of an organohydrogenpolysiloxane.

The amount of component (B) is an amount such that the number of silicon-bonded hydrogen atoms in the component is in a range from 0.1 to 5 mol, preferably in a range from 0.5 to 2 mol, per mol of alkenyl groups in component (A). When the amount of component (B) is above the lower limit of this range, the mechanical strength of the cured product increases. When the amount is below the upper limit of this range, the flexibility of the cured product increases.

Component (C)

Component (C) is a first hydrosilylation catalyst exhibiting activity in the composition without exposure to high energy radiation. Component (C) is the hydrosilylation reaction catalyst for semi-curing the composition. Here, "semi-cured" means a viscous material having fluidity at room temperature or a thermoplastic material exhibiting non-fluidity at room temperature but exhibiting fluidity at 100° C. Here, a viscous material means a composition having a viscosity at 25° C. that is from 1.5 times to 100 times the initial viscosity. A thermoplastic material means a composition having a viscosity at 100° C. of 1,000,000 mPa·s or less.

Examples of first hydrosilylation catalysts include platinum catalysts, rhodium catalysts, palladium catalysts, nickel catalysts, iridium catalysts, ruthenium catalysts, and iron catalysts. A platinum catalyst is preferred. Examples of platinum catalysts include platinum fine powder, platinum black, platinum-supported silica fine powder, platinum-supported activated carbon, chloroplatinic acid, alcohol solutions of chloroplatinic acid, olefin complexes of platinum, and alkenylsiloxane complexes of platinum. Alkenylsiloxane complexes of platinum are especially preferred.

Examples of alkenylsiloxanes include 1,3-divinyl-1,1,3,3-tetramethyldisiloxane, 1,3,5,7-tetramethyl-1,3,5,7-tetravinylcyclotetrasiloxane, alkenyl siloxanes in which some of the methyl groups in the alkenyl siloxane have been substituted with ethyl groups or phenyl groups, and alkenyl siloxanes in which some of the vinyl groups in the alkenyl siloxane have been substituted with allyl groups or hexenyl groups. Because the stability of platinum-alkenylsiloxane complexes is good, 1,3-divinyl-1,1,3,3-tetramethyldisiloxane is especially preferred. Because the stability of platinum-alkenylsiloxane complexes can be improved, these complexes preferably include organosiloxane oligomers, for example, alkenyl siloxanes and dimethyl siloxane oligomers such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, and 1,3,5,7-tetramethyl-1,3,5,7-tetravinylcyclotetrasiloxane. The addition of alkenyl siloxanes is especially preferred.

The catalyst in component (C) exhibits activity without exposure to high energy radiation. However, it preferably also exhibits activity at relatively low temperatures. More specifically, these catalysts exhibit activity in compositions in a range from 0 to 200° C. and promote a hydrosilylation reaction. The amount of component (C) depends on the type of catalyst and the type of composition, but the amount of metal atoms in the catalyst is usually in a range from 0.01 to 50 ppm and preferably in a range from 0.1 to 30 ppm relative to the mass of the composition.

Component (D)

Component (D) is a second hydrosilylation catalyst not exhibiting activity unless exposed to high energy radiation, and exhibiting activity in the composition by exposure to high energy radiation. Component (D) is also known as a high energy radiation activated catalyst or photoactivated catalyst. These are well known in the art.

Here, the high energy radiation can be ultraviolet radiation, gamma radiation, X-ray radiation, alpha radiation, or electron beam radiation, but is preferably ultraviolet radiation, X-ray radiation, or electron beam radiation emitted by a commercially available electron beam emitting device. Ultraviolet radiation at a wavelength from 280 to 380 nm is easy to use industrially. The amount of exposure depends on the type of high energy radiation activated catalyst. In the case of ultraviolet radiation, the total amount of exposure at a wavelength of 365 nm is preferably in a range from 100 mJ/cm$^2$ to 10 J/cm$^2$.

Specific examples of component (D) include (methylcyclopentadienyl) trimethylplatinum (IV), (cyclopentadienyl) trimethylplatinum (IV), (1,2,3,4,5-pentamethylcyclopentadienyl) trimethylplatinum (IV), (cyclopentadienyl) dimethylethylplatinum (IV), (cyclopentadienyl) dimethylacetylplatinum (IV), (trimethylsilylcyclopentadienyl) trimethylplatinum (IV), (methoxycarbonylcyclopentadienyl) trimethylplatinum (IV), (dimethylphenylsilyl cyclopentadienyl) trimethyl cyclopentadienylplatinum (IV), trimethyl (acetylacetonato) platinum (IV), trimethyl (3,5-heptanedionate) platinum (IV), trimethyl (methyl acetoacetate) platinum (IV), bis (2,4-pentanedionato) platinum (II), bis (2,4-hexanedionato) platinum (II), bis (2,4-heptandionato) platinum (II), bis (3,5-heptanedionato) platinum (II), bis (1-phenyl-1,3-butanedionato) platinum (II), bis (1,3-diphenyl-1,3-propanedionato) platinum (II), and bis (hexafluoroacetylacetonato) platinum (II). Among these, (methylcyclopentadienyl) trimethylplatinum (IV) and bis (2,4-pentanedionato) platinum (II) are preferred from the standpoint of versatility and availability.

The amount of component (D) is the amount required to cure a composition half-cured by component (C). The amount of metal atoms in the catalyst is within a range from 1 to 50 ppm and preferably within a range from 5 to 30 ppm relative to the mass of the composition.

The molar ratio ((C)/(D)) of component (C) to component (D) is usually from 0.001 to 1000, and preferably from 0.01 to 100. When the molar ratio is below the upper limit, the curing reaction proceeds quickly when exposed to high energy radiation. When the molar ratio is above the lower limit, the curing reaction can be performed at a low temperature in a short period of time.

The organopolysiloxane composition used in the present invention does not have to contain a hydrosilylation reaction inhibitor. Usually, a hydrosilylation reaction inhibitor is added to the composition to improve the pot life of the composition and obtain a stable composition. However, the present invention can obtain a stable composition without the addition of a hydrosilylation reaction inhibitor. Preferably, the addition of a hydrosilylation reaction inhibitor does not slow down the curing reaction. When a hydrosilylation reaction inhibitor is included, the following compounds can be used: alkyne alcohols such as 2-methyl-3-butyn-2-ol, 3,5-dimethyl-1-hexyn-3-ol and 2-phenyl-3-butyn-2-ol; enyne compounds such as 3-methyl-3-penten-1-yne and 3,5-dimethyl-3-hexen-1-yne; 1,3,5,7-tetramethyl-1,3,5,7-tetravinylcyclotetrasiloxane; 1,3,5,7-tetramethyl-1,3,5,7-tetrahexenylcyclotetrasiloxane; and benzotriazole.

Component (E)

If necessary, other organopolysiloxanes, adhesion-imparting agents, inorganic fillers such as silica, glass, alumina and zinc oxide, organic resin fine powders such as polymethacrylate resins, phosphors, heat-resistant agents, dyes, pigments, flame-retardant agents, and solvents may be added to an organopolysiloxane composition used in the present invention. The amounts and methods of addition are known to those skilled in the art.

The composition can be prepared by uniformly mixing together component (A) to component (D) along with other components if necessary. When the composition is prepared, it can be mixed at room temperature using various stirrers or kneaders, and may be mixed while applying heat if necessary. There are no particular restrictions on the order of addition for each component. They can be mixed together in any order.

A composition of the present invention may be mixed together by kneading together components (A) to (C) in a temperature range from 80° C. to 120° C. while adding component (D). Because the composition as a whole is soft in this temperature range, making it easy to uniformly disperse component (D) in the composition, inadequate curing during the molding of sheets and partial cohesive failure during bonding can be avoided. When the temperature is below the lower limit, the softness is insufficient and it is difficult to uniformly disperse component (D) in the composition even when mechanical force is used. When the temperature exceeds the upper limit, component (D) reacts during mixing causing a significant increase in viscosity or curing. There are no particular restrictions on the powder mixer used in the manufacturing method. Examples include a single or twin-screw continuous mixer, two rolls, a Ross mixer, Hobart mixer, dental mixer, planetary mixer, kneader mixer, Labo Millser Plus, small crusher, or Henschel mixer. A Labo Millser Plus, small crusher, or Henschel mixer is preferred.

The composition may be a one-part composition in which all components in the same container, or a two-part composition mixed together before use to improve storage stability.

(Semi-Cured Product)

Another aspect of the present invention relates to a semi-cured product obtained by conducting a first hydrosilylation reaction on the composition without exposure to high energy radiation.

The first hydrosilylation reaction is promoted by heating the composition at a temperature below 150° C., preferably below 125° C., and more preferably below 100° C. The heating period depends on the type and amount of each component but is usually from 0.2 to 4 hours and preferably from 0.5 to 2 hours.

In this step, the composition becomes semi-cured. Here, "semi-cured" means a viscous material having fluidity at room temperature or a thermoplastic material exhibiting non-fluidity at room temperature but exhibiting fluidity at 100° C. Viscous material and thermoplastic material have the same meaning as above.

(Cured Product)

A cured product is obtained by exposing the semi-cured product to high energy radiation to perform the second hydrosilylation reaction. The types of high energy radiation are the same as those mentioned above. The amount of exposure depends on the type of high energy radiation activated catalyst. In the case of ultraviolet radiation, the total amount of exposure at a wavelength of 365 nm is preferably in a range from 100 mJ/cm$^2$ to 10 J/cm$^2$.

Cured products of the present invention can be used as various types of materials. Here, cured product means it is not fluid even when heated above 200° C. There are no particular restrictions on the hardness of the cured product, which usually ranges from a gel with normal penetration of 70 or less to a resin with a Shore D hardness of 80.

A cured product formed using the method of the present invention has excellent physical properties and especially excellent mechanical strength. Because a cured product is obtained via a stable semi-cured state in the method of the present invention, it can be used in a variety of applications, including adhesives, sealants, and pressure-sensitive adhesives. Because a cured product formed using a method of the present invention has high optical transparency, it can be used in applications such as image display devices, lighting devices, and light-receiving elements.

In this method of forming a cured product, the composition can be applied to a film-like substrate, a tape-like substrate or a sheet-like substrate, and a hydrosilylation reaction can be started by exposing the composition to high energy radiation, allowing it to stand at room temperature, or applying low temperature heat in order to cure the composition. When the composition is arranged between two members and cured to bond the composition securely to both substrates, the composition is applied smoothly to at least one surface of a substrate and semi-cured to non-fluidity before applying the other substrate and curing the composition to secure it to both substrates. There are no particular restrictions on the thickness of the cured product, but is preferably from 1 to 100,000 m and more preferably from 50 to 30,000 m.

The composition can be cured in a relatively low temperature range (from 15 to 80° C.) which includes room temperature. The curing reaction for the composition can be adjusted to the desired rate by changing the concentration of catalytic metal in component (C) and the type and amount of hydrosilylation reaction retarder mentioned above.

These compositions are useful as various types of bonding agents, sealants, adhesives, and pressure-sensitive adhesives. It is especially useful as an optical adhesive or pressure-sensitive adhesive, and really useful as an optical adhesive or pressure-sensitive adhesive, and really useful in displays. Because these cured products do not become discolored or cloudy under high heat or high heat and high humidity conditions, they are suitable as materials for forming the intermediate layer between the image display portions and protective portions of a display.

This composition can be used not only in liquid crystal displays, but in a wide variety of displays, including organic EL displays, electronic paper displays, and plasma displays. The following is a description of how this composition can be used in the field.

Because this composition is cured at a relatively low temperature, it can also be used in a coating for substrates with poor heat resistance. Examples of this type of substrate include transparent substrates such as glass, synthetic resin films and sheets, and transparent electrode film. Examples of application methods for this composition include dispensing, gravure coating, microgravure coating, slit coating, slot die coating, screen printing, stencil printing, and comma coating.

A cured product of the present invention can also be used in the manufacture of laminates. These laminates are preferably at least one type selected from among display devices, electronic components, and solar cell modules. A display device such as an optical display is especially preferred.

In an optical display that is an embodiment of the present invention, a cured product of a curable silicone composition of the present invention is applied by adhesion or pressure-sensitive adhesion between a display unit such as liquid crystals or organic EL and a display forming member such as a touch panel or cover lens or between display forming members to improve the viewability of the optical display.

The image displaying surface of the display may be flat (level) or may be curved. Examples of optical displays include cathode ray tube (CRT) displays and flat panel displays (FPD). Examples of FPDs include light-receiving display devices such as LCDs and electrochromic displays (ECD), electroluminescent display (ELD) devices such as organic EL displays and inorganic EL displays, field emission display (FED) devices such as plasma display panels (PDP) and surface conduction electron-emitting device (SED) displays, and light-emitting display devices such as LED displays.

The following is an explanation of a method for manufacturing a laminate in an embodiment of the present invention. The manufacturing method is typically used for optical members and components in optical displays. Specific examples of these optical members include lenses (made of resin or glass), optical sheet-like members (including color filters, polarizers, retarders, viewing angle widening films, brightness enhancement films, reflection sheets, and transparent conductive films), optically transparent protective materials (transparent protective materials and transparent protective films made of glass, resin, or a resin coating layer), front display panels, touch panels (made of glass or resin), and transparent electrode layers such as ITO or ATO film. Optical protective materials may also be provided on the surface of a display panel or touch panel. The optical member may also be the backlight unit itself, including a light emitting layer and a display surface (display panel). The optical member may be an entire module in a display device consisting of components or a touch panel made of separate laminated members. An optical member may include an adhesive layer 15 made of this cured product. The concept of optical members encompasses the image display panel described below, an optical panel, a front panel, a backlight unit, and a touch panel unit.

The manufacturing method for a laminate in an embodiment of the present invention comprises a step of arranging a curable silicone composition on one or both surfaces of at least one of two optical members and bonding the two optical members together via the composition, and a step of allowing the laminate to stand or applying heat to perform a hydrosilylation reaction and cure the composition.

In the arrangement step, the composition is arranged on the member using one of the application methods described above. In the arrangement step, the composition may be arranged on a surface of one of the optical members. Also, the cured product arranged on both surfaces of an optical member and not bonded to another optical member may be bonded and joined to a release layer or another member.

In the arrangement step of another embodiment, the composition may be arranged on one surface of two optical members.

In this embodiment, the "one surface" is the surface facing the other optical member.

In the arrangement step of another embodiment, the composition may be arranged on the other surface positioned on the opposite side from the one surface.

In the arrangement step, the composition is cured in a low temperature range (15 to 80° C.) that includes room temperature (25° C.). In this embodiment of the present invention, "low temperature" means a temperature in a range from 15° C. to 80° C. When the composition (including a semi-cured product) is to be reacted in a temperature range from 15 to 80° C., the composition may be allowed to stand near room temperature (a temperature range that can be reached without heating or cooling, including especially the temperature range from 20 to 25° C.), or the composition may be cooled to between room temperature and 15° C. or heated to between room temperature and 80° C.

The manufacturing method for a laminate in another embodiment of the present invention comprises a step of arranging a curable silicone composition on one or both surfaces of at least one of two optical members and bonding the two optical members together via the composition, a step of curing the composition by allowing it to stand or by applying heat to conduct a hydrosilylation reaction on the composition after exposure to high energy radiation via a transparent member.

In the curing step, there is exposure to high energy radiation. In this way, a cured product is obtained by curing the composition. As mentioned above, the high energy radiation is preferably ultraviolet radiation.

Another embodiment of the present invention is a method for manufacturing a laminate, the method comprising
step i): arranging the composition on one or both surfaces of at least one of two optical members;
step ii): exposing the composition arranged in step i) to high energy radiation until the composition is in a non-fluid semi-cured state;
step iii): bonding the two optical members together via the curable silicone composition in a semi-cured state after step ii); and
step iv): conducting a hydrosilylation reaction on the composition in a semi-cured state in the two optical members bonded in step iii) in a temperature range from 15 to 80° C. to cure the composition.

In the semi-curing step, there is exposure to high energy radiation. In this way, a semi-cured product is obtained by hydrosilylation reaction.

In the curing step, the curing reaction is continued on the semi-cured product in a temperature range from 15 to 80° C. In this way, a cured product is obtained by further curing the semi-cured product.

Another embodiment of the present invention is a method for manufacturing a laminate, the method comprising
step i): arranging a composition on one or both surfaces of at least one of two optical members, at least one of the members being a transparent optical member;
step ii): conducting a hydrosilylation reaction on the composition arranged in step i) in a temperature range from 15 to 80° C. until the composition is in a non-fluid semi-cured state;
step iii): bonding the two optical members together via the curable silicone composition in a semi-cured state after step ii); and
step iv): exposing the curable silicone composition to high energy radiation in the two optical members bonded in step iii) via the transparent optical member and then conducting a hydrosilylation reaction on the composition in a semi-cured state in a temperature range from 15 to 80° C. to cure the composition.

In the semi-curing step, the composition is reacted in a temperature range from 15 to 80° C. In this way, a semi-cured product is obtained by hydrosilylation reaction.

In the curing step, the semi-cured product is exposed to high energy radiation. In this way, a cured product is obtained by further curing the semi-cured product.

Because this composition has excellent curability and produces a cured product that remains transparent and less susceptible to cloudiness and discoloration even when exposed to high temperature/high humidity conditions, it can be used as an adhesive or pressure-sensitive adhesive in display devices such as optical displays (including touch panels) and in optical semiconductor devices (including MicroLEDs). This composition can be used without restriction to bond or fill transparent members in addition to optical displays, and can be used in the adhesive layers of solar cells, multi-layer glass (smart glass), optical waveguides, and projector lenses (in the lamination of multi-layer lenses and polarization/optical film).

Because this composition produces a cured product with low curing shrinkage, it has the general advantages of silicone OCRs, such as the ability to suppress defects such as display defects, optical member defects, and uneven reflection. Because it has flexibility as mentioned above, it has good conformability to adherends. Because strong adhesive force develops over time, the peeling between members is also effectively suppressed. As a result, the composition can be used in the optical adhesive layers of in-vehicle displays with a flat or curved display surface and head-up displays using projector lenses.

EXAMPLES

Cured products were obtained using compositions with the following components. In the average composition formulas, Me and Vi refer to methyl groups and vinyl groups, respectively.

Example 1

A composition was prepared comprising: 3.5 parts by weight of a vinyl-capped branched polysiloxane (A-1) represented by the average composition formula: (Me$_2$ViSiO$_{1/2}$)$_{0.044}$(Me$_3$SiO$_{1/2}$)$_{0.411}$(SiO$_{4/2}$)$_{0.545}$; 89.7 parts by weight of a vinyl-capped linear polysiloxane (A-2) represented by the average composition formula: ViMe$_2$SiO (SiMe$_2$O)$_{322}$SiMe$_2$Vi; 6.8 parts by weight of a linear polysiloxane (B-1) represented by the average composition formula: HMe$_2$SiO(SiMe$_2$O)$_{10}$SiMe$_2$H; 5 ppm of a platinum-1,3-divinyl-1,1,3,3-tetramethyldisiloxane complex (C-1) in terms of platinum atoms; and 20 ppm of (methylcyclopentadienyl) trimethylplatinum (IV) (D-1) in terms of platinum atoms. The viscosity of the composition was 1,800 mPa·s. After preparing the composition and allowing it to stand for 10 minutes to reach a viscosity of 3,200 mPa·s, the composition was exposed via an ozone cut filter to a 2 W high-pressure mercury lamp at a 365-nm UV exposure level of 5,000 mJ/cm$^2$. The viscosity measured immediately thereafter was above 30,000 mPa·s, but the composition remained fluid. It became a non-fluid gel after 5 more minutes of UV exposure. When the hardness of the cured product was measured by penetration every 10 minutes, the hardness stabilized at a penetration of 32 after one hour of UV exposure indicating the curing reaction was complete.

Example 2

A composition was prepared comprising: 3.5 parts by weight of A-1; 6.5 parts by weight of A-2; 82.4 parts by weight of a vinyl-capped linear polysiloxane (A-3) represented by the average composition formula: ViMe$_2$SiO (SiMe$_2$O)$_{535}$SiMe$_2$Vi; 4.6 parts by weight of B-1; 10 ppm of C-1 in terms of platinum atoms; and 20 ppm of D-1 in terms of platinum atoms. The viscosity of the composition was 8,200 mPa·s. After preparing the composition and allowing it to stand for 10 minutes to reach a viscosity of 14,000 mPa·s, the composition was exposed via an ozone cut filter to a 2 W high-pressure mercury lamp at a 365-nm UV exposure level of 2,500 mJ/cm$^2$. The viscosity measured immediately thereafter was above 50,000 mPa·s, but the composition remained fluid. It became a non-fluid gel after 10 more minutes of UV exposure. When the hardness of the cured product was measured by penetration every 10 minutes, the hardness stabilized at a penetration of 35 after one hour of UV exposure indicating the curing reaction was complete.

Example 3

A composition was prepared comprising: 55.7 parts by weight of a vinyl-capped branched polysiloxane (A-4) represented by the average composition formula: (Me$_2$ViSiO$_{1/2}$)$_{0.1}$(Me$_3$SiO$_{1/2}$)$_{0.4}$(SiO$_{4/2}$)$_{0.5}$; 13.3 parts by weight of a branched polysiloxane (E-1) represented by the average composition formula: (Me$_3$SiO$_{1/2}$)$_{0.44}$(SiO$_{4/2}$)$_{0.56}$; 1.7 parts by weight of a vinyl-capped linear polysiloxane (A-3) represented by the average composition formula: ViMe$_2$SiO (SiMe$_2$O)$_{160}$SiMe$_2$Vi; 24.6 parts by weight of a linear polysiloxane (B-2) represented by the average composition formula: HMe$_2$SiO(SiMe$_2$O)$_{400}$SiMe$_2$H; 4.7 parts by weight of a linear polysiloxane (B-3) represented by the average composition formula: Me$_3$SiO(SiMe$_2$O)$_{30}$(SiMeHO)$_{30}$SiMe$_3$; 0.2 ppm of C-1 in terms of platinum atoms; and 5 ppm of D-1 in terms of platinum atoms. The viscosity of the composition was 3,500 mPa·s. The composition was heated for 30 minutes at 90° C. A thermoplastic material was obtained that was not fluid at 25° C. but was fluid at 100° C. Even after two months in storage at 25° C., the resulting thermoplastic material did not lose fluidity at 100° C. After exposure via an ozone cut filter to a 2 W high-pressure mercury lamp at a 365-nm UV exposure level of 2,500 mJ/cm$^2$ and then heated for 30 minutes at 120° C., the thermoplastic material became a cured product with a Shore A hardness of 80.

Example 4

A composition was prepared comprising: 32.2 parts by weight of A-4; 28.5 parts by weight of E-1; 20.7 parts by weight of A-3; 15.7 parts by weight of B-2; 2.9 parts by weight of B-3; 0.1 ppm of C-1 in terms of platinum atoms; and 5 ppm of D-1 in terms of platinum atoms. The viscosity of the composition was 2,800 mPa·s. The composition was heated for 30 minutes at 90° C. A thermoplastic material was obtained that was not fluid at 25° C. but was fluid at 100° C. Even after two months in storage at 25° C., the resulting thermoplastic material did not lose fluidity at 100° C. After exposure via an ozone cut filter to a 2 W high-pressure mercury lamp at a 365-nm UV exposure level of 2,500 mJ/cm$^2$ and then heated for 30 minutes at 120° C., the thermoplastic material became a cured product with a Shore A hardness of 35.

Example 5

A composition was prepared comprising: 93.6 wt % vinyl-capped polysiloxane (A-5) represented by the average composition formula: ViMe$_2$SiO(SiMePhO)$_{36}$SiMe$_2$Vi; 1.0 wt % vinyl group-containing polysiloxane (A-6) represented by the average composition formula: (ViMe$_2$SiO$_{1/2}$)$_{0.22}$(MeXSiO$_{2/2}$)$_{0.12}$(PhSiO$_{3/2}$)$_{0.66}$ (where X represents a glycidoxypropyl group); 3.9 wt % linear polysiloxane (B-3) represented by the molecular formula: Ph$_2$Si(OSiMe$_2$H)$_2$; 1.3 wt % branched polysiloxane (B-4) represented by the average composition formula: (HMe$_2$SiO$_{1/2}$)$_{0.6}$(PhSiO$_{3/2}$)$_{0.4}$; 0.2 wt % glycidoxypropyltrimethoxysilane; 5 ppm of C-1 in terms of platinum atoms; and 20 ppm of D-1 in terms of platinum atoms. The viscosity of the composition was 6,000 mPa·s. When the composition was allowed to stand for 10 minutes at 25° C., a viscous material with a viscosity of about 12,000 mPa·s was obtained. The viscous material was exposed via an ozone cut filter to a 2 W high-pressure mercury lamp at a 365-nm UV exposure level of 2,500 mJ/cm$^2$. Once 15 minutes had passed at 25° C. after UV exposure, the composition had changed into a non-fluid gel. Once 40 minutes had passed at 25° C., it had become a cured product with a penetration of 35.

Comparative Example 1

A composition was prepared comprising: 3.5 parts by weight of A-1; 89.7 parts by weight of A-2; 6.8 parts by weight of B-1; and 60 ppm of C-1 in terms of platinum atoms. The viscosity of the composition was 1,800 mPa·s. After preparation of the composition, the composition immediately gave off heat and became a non-fluid gel after one minute. Curing occurred too quickly to prepare a sample for penetration measurement, and the composition turned dark brown.

Comparative Example 2

A composition was prepared comprising: 3.5 parts by weight of A-1; 89.7 parts by weight of A-2; 6.8 parts by weight of B-1; and 20 ppm of D-1 in terms of platinum atoms. The viscosity of the composition was 1,800 mPa·s.

After preparing the composition and allowing it to stand for 10 minutes to reach a constant viscosity of 1,800 mPa·s, the composition was exposed via an ozone cut filter to a 2 W high-pressure mercury lamp at a 365-nm UV exposure level of 5,000 mJ/cm². The viscosity measured immediately thereafter had reached 3,200 mPa·s. It did not gel even after 1 more hour of UV exposure. Therefore, when heated to 100° C., it gradually became non-fluid after 30 minutes.

Comparative Example 3

A composition was prepared comprising: 55.7 parts by weight of A-4; 13.3 parts by weight of E-1; 1.7 parts by weight of A-3; 24.6 parts by weight of B-2; 4.7 parts by weight of B-; and 2 ppm of C-1 in terms of platinum atoms. The viscosity of the composition was 3,500 mPa·s. The composition was heated for 30 minutes at 90° C. to obtain a cured product with a Shore A hardness of 80. When the composition was heated for 30 minutes at 50° C. to obtain a softer cured product, a cured product with a Shore A hardness of 40 was obtained. The cured product did not exhibit high-temperature fluidity and became harder over time. After two weeks at 25° C., the cured product had a Shore A hardness of 75.

Comparative Example 4

A composition was prepared comprising: 32.2 parts by weight of A-4; 28.5 parts by weight of E-1; 20.7 parts by weight of A-3; 15.7 parts by weight of B-2; 2.9 parts by weight of B-3; 0.1 ppm of C-1 in terms of platinum atoms; and 5 ppm of D-1 in terms of platinum atoms. The viscosity of the composition was 2,800 mPa·s. The composition was heated for 30 minutes at 90° C., but no change in the composition was observed.

Comparative Example 5

A composition was prepared comprising: 94.0 parts by weight of A-2; 4.1 parts by weight of B-2; 1.4 parts by weight of B-3; and 5 ppm of C1 in terms of platinum atoms. The viscosity of the composition was 2,100 mPa·s. The composition gelled after 30 minutes at 25° C.

Comparative Example 6

A composition was prepared comprising: 93.6 wt % of A-5; 1.0 wt % of A-6; 3.9 wt % of B-3; 1.3 wt % of B-4; 0.2 wt % of glycidoxypropyltrimethoxysilane; and 5 ppm of C-1 in terms of platinum atoms. The viscosity of the composition was 6,000 mPa·s. When the composition was allowed to stand for 10 minutes at 25° C., a viscous material with a viscosity of about 12,000 mPa·s was obtained. The viscous material was exposed via an ozone cut filter to a 2 W high-pressure mercury lamp at a 365-nm UV exposure level of 2,500 mJ/cm². Once 60 minutes had passed at 25° C. after UV exposure, the composition had changed into a non-fluid gel. Once 2 hours had passed at 25° C., the penetration continued to decline and the curing reaction remained incomplete.

INDUSTRIAL APPLICABILITY

Because a composition of the present invention has a sufficient pot life at room temperature and can be cured at low temperature by exposure to high energy radiation, it can be used as an adhesive or pressure-sensitive adhesive between the layers of an image display device.

The invention claimed is:

1. A composition comprising:
   (A) a compound containing at least one aliphatically unsaturated monovalent hydrocarbon group in the molecule;
   (B) a compound containing at least two hydrogen atoms bonded to silicon atoms in the molecule;
   (C) a first hydrosilylation catalyst exhibiting activity in the composition without exposure to high energy radiation; and
   (D) a second hydrosilylation catalyst not exhibiting activity unless exposed to high energy radiation, and exhibiting activity in the composition by exposure to high energy radiation; wherein component (B) comprises an organohydrogenpolysiloxane represented by average composition formula (3):

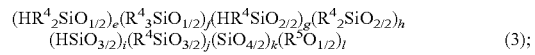

$$(HR^4{}_2SiO_{1/2})_e(R^4{}_3SiO_{1/2})_f(HR^4SiO_{2/2})_g(R^4{}_2SiO_{2/2})_h(HSiO_{3/2})_i(R^4SiO_{3/2})_j(SiO_{4/2})_k(R^5O_{1/2})_l \quad (3);$$

where $R^4$ is a group selected from among an aliphatic unsaturated bond-free monovalent hydrocarbon group, a hydroxyl group and an alkoxy group having from 1 to 12 carbon atoms, $R^5$ is a hydrogen atom or an alkyl group having from 1 to 6 carbon atoms, and e, f, g, h, i, j, k and l are numbers that satisfy the following conditions: $e+f+g+h+i+j+k=1$, $0 \le l \le 0.1$, $0.01 \le e+g+i \le 0.2$, $0.01 \le e \le 0.6$, $0.01 \le g \le 0.6$, $0 \le i \le 0.4$, $0.01 \le e+f \le 0.8$, $0.01 \le g+h \le 0.8$, and $0 \le i+j \le 0.6$.

2. The composition according to claim 1, wherein the high energy radiation is selected from the group consisting of ultraviolet radiation, gamma radiation, X-ray radiation, alpha radiation, and electron beam radiation.

3. The composition according to claim 1, wherein component (A) is an organopolysiloxane.

4. The composition according to claim 1, wherein component (A) is an organopolysiloxane represented by average composition formula (1):

$$R^1{}_aR^2{}_bSiO_{(4-a-b)/2} \quad (1);$$

where $R^1$ is an alkenyl group having from 2 to 12 carbon atoms, $R^2$ is a group selected from among an aliphatic unsaturated bond-free monovalent hydrocarbon group, a hydroxyl group and an alkoxy group having from 1 to 12 carbon atoms, and a and b are numbers that satisfy the following conditions: $1 \le a+b \le 3$ and $0.001 \le a/(a+b) \le 0.33$.

5. The composition according to claim 1, wherein the molar ratio ((C/(D)) of component (C) to component (D) is from 0.001 to 1,000.

6. The composition according to claim 1, wherein component (C) is at least one transition metal complex catalyst selected from the group consisting of platinum, palladium, rhodium, nickel, iridium, ruthenium, and iron complexes.

7. The composition according to claim 1, wherein component (D) is at least one catalyst selected from the group consisting of (substituted and unsubstituted cyclopentadienyl) trimethylplatinum (IV), β-diketonato trimethylplatinum (IV), and bis (β-diketonato) platinum (II).

8. A semi-cured product obtained by conducting a first hydrosilylation reaction on the composition according to claim 1 without exposure to high energy radiation.

9. A cured product obtained by exposing the semi-cured product according to claim 8 to high energy radiation.

10. A method for manufacturing a laminate, the method comprising:
- i) arranging the composition according to claim 1 on one or both surfaces of at least one of two optical members;
- ii) exposing the composition arranged in step i) to high energy radiation until the composition is in a non-fluid semi-cured state;
- iii) bonding the two optical members together via the curable silicone composition in a semi-cured state after step ii); and
- iv) conducting a hydrosilylation reaction on the composition in a semi-cured state in the two optical members bonded in step iii) in a temperature range from 15 to 80° C. to cure the composition.

11. The method for manufacturing a laminate according to claim 10, wherein the laminate is an optical display.

12. A method for manufacturing a laminate, the method comprising
- i) arranging the composition according to claim 1 on one or both surfaces of at least one of two optical members, at least one of the members being a transparent optical member;
- ii) conducting a hydrosilylation reaction on the composition arranged in step i) in a temperature range from 15 to 80° C. until the composition is in a non-fluid semi-cured state;
- iii) bonding the two optical members together via the curable silicone composition in a semi-cured state after step ii); and
- iv) exposing the curable silicone composition to high energy radiation in the two optical members bonded in step iii) via the transparent optical member and then conducting a hydrosilylation reaction on the composition in a semi-cured state in a temperature range from 15 to 80° C. to cure the composition.

13. The method for manufacturing a laminate according to claim 12, wherein the laminate is an optical display.

* * * * *